(12) United States Patent
Zhu et al.

(10) Patent No.: US 11,737,338 B2
(45) Date of Patent: Aug. 22, 2023

(54) DISPLAY PANEL, METHOD FOR MANUFACTURING THE SAME AND DISPLAY DEVICE

(71) Applicants: Mianyang BOE Optoelectronics Technology Co., Ltd., Sichuan (CN); BOE Technology Group Co., Ltd., Beijing (CN)

(72) Inventors: Li Zhu, Beijing (CN); Shijun Li, Beijing (CN)

(73) Assignees: MIANYANG BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 332 days.

(21) Appl. No.: 17/278,698

(22) PCT Filed: Jun. 12, 2020

(86) PCT No.: PCT/CN2020/095819
§ 371 (c)(1),
(2) Date: Mar. 23, 2021

(87) PCT Pub. No.: WO2021/248453
PCT Pub. Date: Dec. 16, 2021

(65) Prior Publication Data
US 2022/0199697 A1    Jun. 23, 2022

(51) Int. Cl.
*H10K 59/40* (2023.01)
*H10K 50/84* (2023.01)
(Continued)

(52) U.S. Cl.
CPC .......... *H10K 59/40* (2023.02); *G06F 3/0412* (2013.01); *H10K 50/84* (2023.02); *H10K 59/122* (2023.02);
(Continued)

(58) Field of Classification Search
CPC .... H10K 59/40; H10K 50/84; H10K 59/1213; H10K 59/122; H10K 59/131;
(Continued)

(56) References Cited

U.S. PATENT DOCUMENTS

2017/0331058 A1* 11/2017 Seo ................. H10K 59/50
2018/0350884 A1   12/2018 Won et al.
(Continued)

FOREIGN PATENT DOCUMENTS

CN    108321181 A    7/2018
CN    108874256 A    11/2018
(Continued)

OTHER PUBLICATIONS

Extended European search report of counterpart European application No. 20939981.5 dated Nov. 16, 2022.
(Continued)

*Primary Examiner* — Kyoung Lee
(74) *Attorney, Agent, or Firm* — Lippes Mathias LLP

(57) ABSTRACT

Provided is a display panel, including: a substrate comprising: a display region, a peripheral region and a pad region; a first dam; a planarization layer disposed within the first dam, wherein a first groove is defined between the first dam and the planarization layer, and wherein an edge of a first side of the planarization layer comprises a first segment boundary and a second segment boundary that are connected; a packaging layer covering the planarization layer; and a touch layer disposed on the packaging layer, wherein the touch layer comprises a touch signal line and a touch
(Continued)

electrode pattern, the a touch electrode pattern being electrically connected to a pad in the pad region by the touch signal line which travels through the first segment boundary; wherein the packaging layer comprises an organic layer, an edge of the organic layer being disposed in the first groove.

20 Claims, 10 Drawing Sheets

(51) Int. Cl.
    *G06F 3/041*     (2006.01)
    *H10K 59/122*     (2023.01)
    *H10K 59/131*     (2023.01)
    *H10K 59/121*     (2023.01)
    *H10K 71/00*     (2023.01)

(52) U.S. Cl.
    CPC ....... *H10K 59/1213* (2023.02); *H10K 59/131* (2023.02); *H10K 71/00* (2023.02)

(58) Field of Classification Search
    CPC ................. H10K 71/00; H10K 50/844; H10K 2102/341; H10K 59/124; G06F 3/0412; G06F 3/04164; G06F 3/0446
    See application file for complete search history.

(56) References Cited

U.S. PATENT DOCUMENTS

2019/0280060 A1    9/2019   Liu et al.
2019/0326375 A1   10/2019   Ochi et al.

FOREIGN PATENT DOCUMENTS

| CN | 110196656 A | 9/2019 |
|---|---|---|
| CN | 210379052 U | 4/2020 |

OTHER PUBLICATIONS

International search report of PCT application No. PCT/CN2020/095819 dated Mar. 10, 2021.

\* cited by examiner

DISPLAY PANEL, METHOD FOR MANUFACTURING THE SAME AND DISPLAY DEVICE

CROSS-REFERENCE TO RELATED APPLICATIONS

This application is a 371 of PCT Application No. PCT/CN2020/095819, filed on Jun. 12, 2020, the disclosures of which are herein incorporated by reference in their entireties.

TECHNICAL FIELD

The present disclosure relates to the field of displays, and in particular relates to a display panel, a method for manufacturing the same, and a display device.

BACKGROUND

A touch sensor panel (TSP) is a panel combining a display panel and a touch structure into one device, and may realize display and touch functions at the same time.

SUMMARY

Embodiments of the present disclosure provide a display panel, a method for manufacturing the same, and a display device.

In an aspect, a display panel is provided. The display panel includes:
 a substrate including:
  a display region;
  a peripheral region surrounding the display region; and
  a pad region disposed on a side, distal from the display region, of the peripheral region;
 a first dam disposed in the peripheral region and surrounding the display region;
 a planarization layer disposed within the first dam, wherein a first groove is defined between the first dam and the planarization layer, and wherein an edge of a first side of the planarization layer, along an extending direction of the edge of the first side, includes a first segment boundary and a second segment boundary that are connected, and the first side and the pad region are disposed on a same side of the display region;
 a packaging layer covering the planarization layer; and
 a touch layer disposed on the packaging layer, wherein the touch layer includes a touch signal line and a touch electrode pattern, one end of the touch signal line being electrically connected to the touch electrode pattern, the other end of the touch signal line, extending from the display region to the pad region and traveling through the first segment boundary, and being electrically connected to a pad in the pad region;
 wherein the packaging layer includes an organic layer, an edge of the organic layer on a same side of the display region as the first side of the planarization layer being disposed in the first groove, and a distance between the edge of the organic layer and the first segment boundary of the planarization layer being greater than a distance between the edge of the organic layer and the second segment boundary.

In some embodiments of the present disclosure, the first side of the planarization layer includes a first segment ramp and a second segment ramp that are connected, wherein a bottom side of the first segment ramp is the first segment boundary and a bottom side of the second segment ramp is the second segment boundary; and a height of the first segment ramp is greater than a height of the second segment ramp, wherein the height of the first segment ramp is a distance from a top surface of the first segment ramp to a bottom surface of the substrate in the direction perpendicular to a bearing surface of the substrate, and the height of the second segment ramp is a distance from a top surface of the second segment ramp to the bottom surface of the substrate in the direction perpendicular to the bearing surface of the substrate.

In some embodiments of the present disclosure, a distance between an edge of the first dam opposite to the second segment boundary and the second segment boundary is less than a distance between an edge of the first dam opposite to the first segment boundary and the first segment boundary.

In some embodiments of the present disclosure the display panel further includes a thin film transistor array layer on which the planarization layer is disposed; and
 wherein the thin film transistor array layer includes a gate line and a data line that extend from the display region to the pad region and travel through the second segment boundary.

In some embodiments of the present disclosure, wherein a length of the organic layer between the first segment boundary and the first dam in the extending direction of the edge of the first side is within a range of 1 mm to 3 mm.

In some embodiments of the present disclosure, the distance between the edge of the organic layer and the first segment boundary is within a range of 50 µm to 150 µm.

In some embodiments of the present disclosure, the first side of the planarization layer, along the extending direction of the edge of the first side, includes two of the first segment boundaries respectively disposed at both sides of the second segment boundary.

In some embodiments of the present disclosure, a first ramp with a ramp angle within a range of 1 degree to 35 degrees is formed by the organic layer between the first segment boundary and the first dam.

In some embodiments of the present disclosure, the planarization layer includes a first planarization layer and a second planarization layer; and
 the display region further includes a first pixel definition layer disposed on the second planarization layer;
 wherein a second ramp is formed by the first planarization layer and the second planarization layer corresponding to the first segment boundary, and a portion, proximal to the pad region, of the first pixel definition layer, and edges of the first planarization layer and the second planarization layer corresponding to the first segment boundary are overlapped with an edge of the first pixel definition layer.

In some embodiments of the present disclosure, a ramp angle of the second ramp is within a range of 35 degrees to 55 degrees.

In some embodiments of the present disclosure, a distance between an edge of the first dam opposite to the second segment boundary and the second segment boundary is less than a distance between the edge of the first dam opposite to the second segment boundary and an edge of the first pixel definition layer opposite to the second segment boundary.

In some embodiments of the present disclosure, the display panel further includes a second dam disposed in the peripheral region and surrounding the first dam;
 wherein a second groove is defined between the first dam and the second dam; a height of the second dam is greater than a height of the first dam; and a distance between a first surface of the planarization layer and a second surface of the first pixel definition layer is greater than the height of the second dam; wherein the height of the first dam is a distance between a top surface, distal from the substrate, of the first dam and the first surface of the planarization layer in the direction perpendicular to the bearing surface of the substrate, the height of the second dam is a distance between a top surface, distal from the substrate, of the second dam and the first surface of the planarization layer in the direction perpendicular to the bearing surface of the substrate, the first surface of the planarization layer is a surface, proximal to the substrate, of the planarization layer, and the second surface of the first pixel definition layer is a surface, distal from the substrate, of the first pixel definition layer.

In some embodiments of the present disclosure, the first dam includes a third planarization layer, a second pixel definition layer and a photo spacer layer that are sequentially laminated; and the second dam includes the third planarization layer, a fourth planarization layer, the second pixel definition layer, and the photo spacer layer that are sequentially laminated;

wherein the third planarization layer and the first planarization layer are disposed in a same layer, the fourth planarization layer and the second planarization layer are disposed in a same layer, and the second pixel definition layer and the first pixel definition layer are disposed in a same layer.

In some embodiments of the present disclosure, a difference between the height of the second dam and the height of the first dam is within a range of 0.4 μm to 1.0 μm.

In some embodiments of the present disclosure, the touch electrode pattern includes a plurality of touch drive electrodes and a plurality of touch sense electrodes that are crosswise arranged; wherein intersections of the touch drive electrodes and the touch sense electrodes are insulated and separated by a touch insulation layer, and each of the touch drive electrodes and each of the touch sense electrodes are both correspondingly connected to one of the touch signal lines.

In some embodiments of the present disclosure, the packaging layer further includes a first inorganic packaging layer and a second inorganic encapsulating layer, and the organic layer is disposed between the first inorganic packaging layer and the second inorganic packaging layer.

In some embodiments of the present disclosure, in the display region, a thin film transistor array layer, the planarization layer, a first pixel definition layer, a photo spacer layer, a light emitting layer, the packaging layer, and the touch layer are laminated on the substrate.

In some embodiments of the present disclosure, in the peripheral region, the thin film transistor array layer, a third planarization layer, a fourth planarization layer, a second pixel definition layer, the photo spacer layer, the packaging layer, and the touch layer are laminated on the substrate.

In some embodiments of the present disclosure, the display panel further includes a polarizer and a cover plate laminated on the touch layer.

In another aspect, a method for manufacturing a display panel is provided. The method for manufacturing a display panel includes:

forming a first dam, a planarization layer, and a packaging layer on a substrate, wherein the substrate includes a display region, a peripheral region surrounding the display region, and a pad region disposed at a side, distal from the display region, of the peripheral region; wherein the first dam is disposed in the peripheral region and surrounding the display region; the planarization layer is disposed within the first dam, a first groove is defined between the first dam and the planarization layer, an edge of a first side of the planarization layer, along an extending direction of the edge of the first side, includes a first segment boundary and a second segment boundary that are connected, and the first side and the pad region are disposed on a same side of the display region; and the packaging layer includes an organic layer, a distance between an edge of the organic layer and the first segment boundary of the planarization layer being greater than a distance between the edge of the organic layer and the second segment boundary; and forming a touch layer on the packaging layer, wherein the touch layer includes a touch signal line and a touch electrode pattern, one end of the touch signal line being electrically connected to the touch electrode pattern, the other end of the touch signal line, extending from the display region to the pad region and traveling through the first segment boundary, and being electrically connected to a pad in the pad region.

In yet another aspect, a display device is provided. The display device includes any one of the above display panels.

BRIEF DESCRIPTION OF THE DRAWINGS

For clearer descriptions of the technical solutions in the embodiments of the present disclosure, the following briefly introduces the accompanying drawings required for describing the embodiments. Obviously, the accompanying drawings in the following description show merely some embodiments of the present disclosure, and a person of ordinary skill in the art may still derive other drawings from these accompanying drawings without creative efforts.

DETAILED DESCRIPTION

In order to make the objectives, technical solutions, and advantages of the present disclosure clearer, the implementations of the present disclosure are further described below in detail with reference to the accompanying drawings.

In the related art, a display panel includes a display region and a peripheral region surrounding the display region. The peripheral region is provided with a first dam surrounding the display region. A first groove is defined between a boundary of a planarization (PLN) layer disposed in the display region and the first dam. A touch structure includes touch electrodes disposed in the display region, and touch traces connecting the touch electrodes and a driving IC. The touch traces extend to the peripheral region through a side edge of the planarization layer.

During a manufacturing process of the display panel, a touch material layer needs to be exposed and etched to form touch traces. Since a depth of the first groove at an edge of the planarization layer through which the touch trace travels is deeper than an exposure depth, such that a touch material residue of the touch material layer in the first groove is generated during exposure and etching and easily causes short circuits between the formed touch traces, resulting in touch failure.

Figure 1:
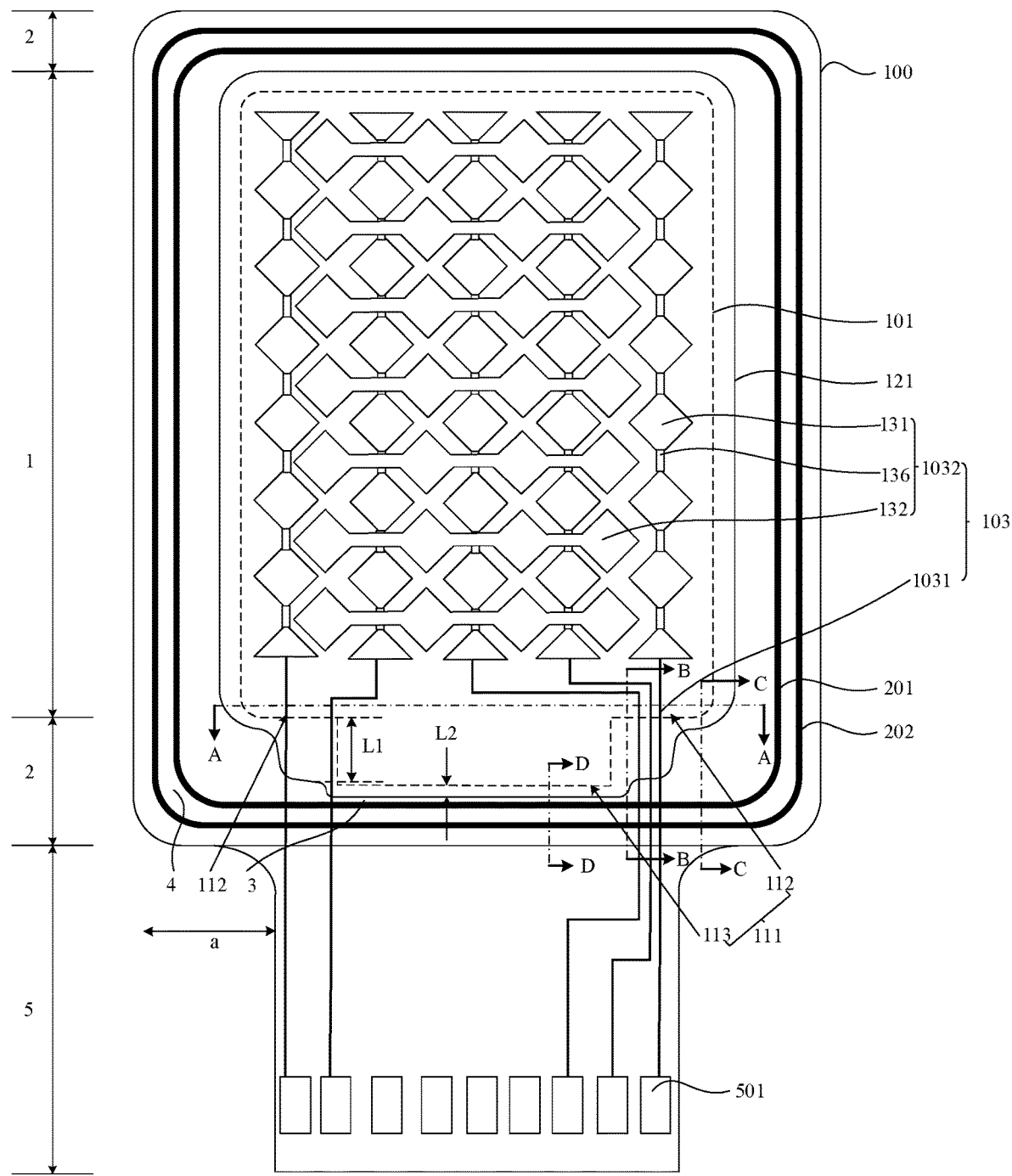
FIG. 1 is a top view of a display panel according to an embodiment of the present disclosure.

FIG. 1 is a top view of a display panel according to an embodiment of the present disclosure. Referring to FIG. 1, the display panel includes: a substrate 100, a first dam 201, a planarization layer 101, and a touch layer 103.

The substrate 100 includes a display region 1, a peripheral region 2 surrounding the display region 1, and a pad region 5 disposed at a side, distal form the display region 1, of the peripheral region 2. The first dam 201 is disposed in the peripheral region 2 and surrounds the display region 1. The planarization layer 101 is disposed within the first dam 201, and a first groove 3 is defined between the first dam 201 and the planarization layer 101. An edge of a first side 111 of the planarization layer 101, along an extending direction of the edge of the first side 111, includes a first segment boundary 112 and a second segment boundary 113 that are connected, and the first side 111 and the pad region 5 are disposed at a same side of the display region 1. The first side 111 of the planarization layer 101 is one of sides of the planarization layer 101. A bearing surface is a surface of the substrate 100 toward the planarization layer 101. The touch layer 103 includes touch signal lines 1031 and a touch electrode pattern 1032, one end of the touch signal line 1031 is electrically connected to the touch electrode pattern 1032, the other end of the touch signal line 1031 extends from the display region 1 to the pad region 5 and travels through the first segment boundary 112, and is electrically connected to a pad 501 of the pad region 5.

Figure 2:
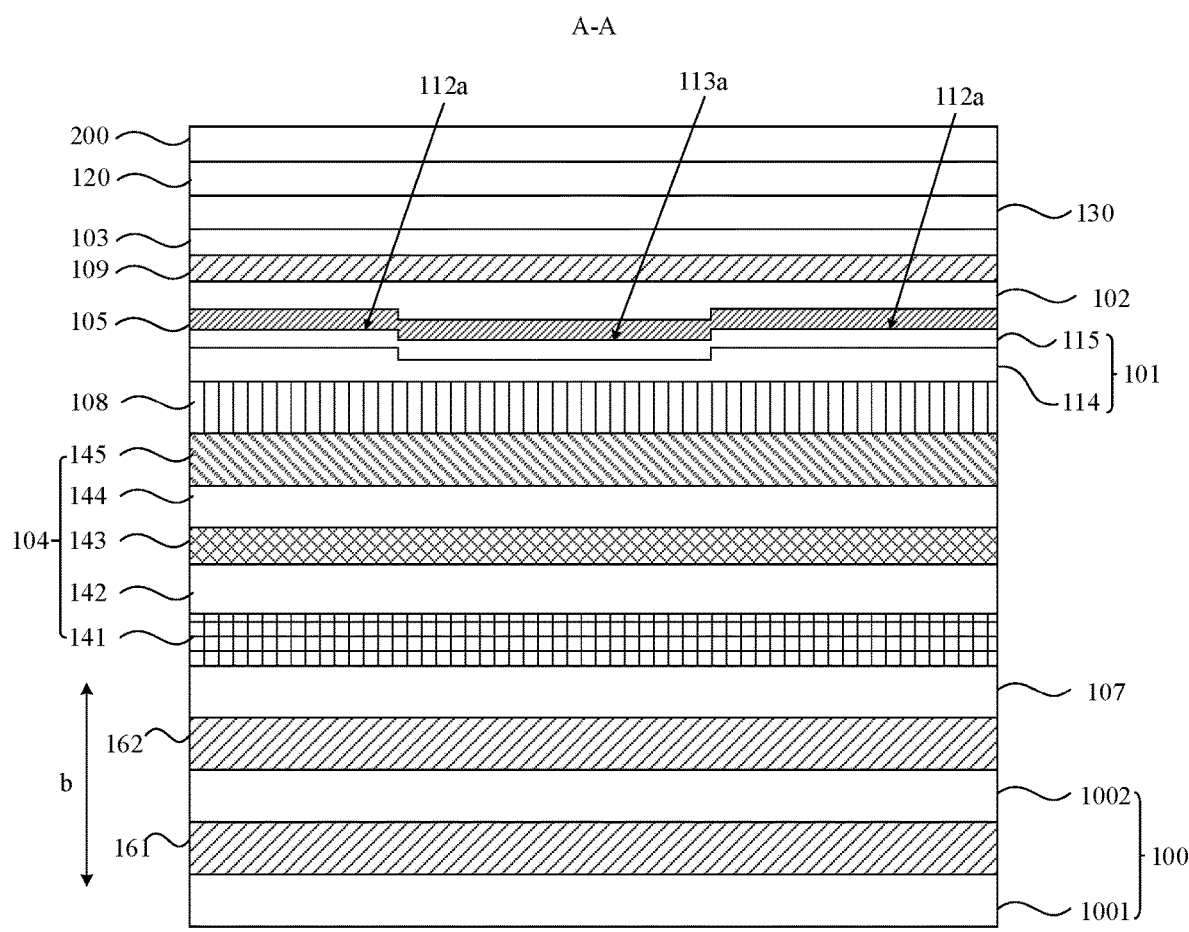
FIG. 2 is a schematic diagram of a cross section of the A-A plane in FIG. 1.

FIG. 2 is a schematic diagram of a cross section of the A-A plane in FIG. 1. Referring to FIG. 2, the display panel further includes a packaging layer 102. The packaging layer 102 covers the planarization layer 101.

Figure 3:
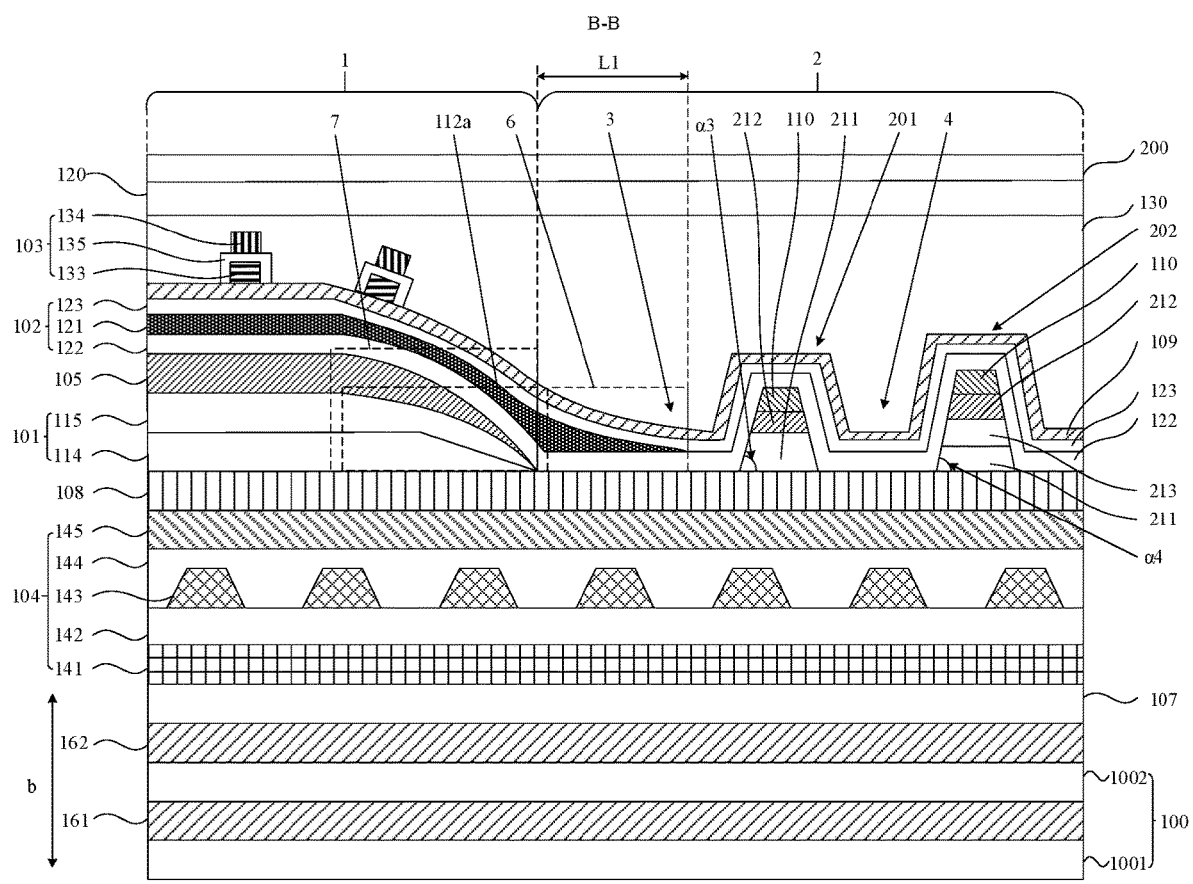
FIG. 3 is a schematic diagram of a cross section of the B-B plane in FIG. 1.

FIG. 3 is a schematic diagram of a cross section of the B-B plane in FIG. 1. Referring to FIG. 3, the touch layer 103 is disposed on the packaging layer 102, and the packaging layer 102 includes an organic layer 121. With reference to FIG. 1, an edge of the organic layer 121 on a same side of the display region 1 as the first side 111 of the planarization layer 101 is disposed in the first groove 3, and a distance L1 between the edge of the organic layer 121 and the first segment boundary 112 of the planarization layer 101 is greater than a distance L2 between the edge of the organic layer 121 and the second segment boundary 113 of the planarization layer 101.

In an embodiment of the present disclosure, the peripheral region of the substrate is provided with the first dam surrounding the display region; the planarization layer, the packaging layer, and the touch layer are disposed in the first dam; and a first groove is defined between the first dam and the planarization layer.

The edge of the first side of the planarization layer includes a first segment boundary and a second segment boundary that are connected, and the touch signal line travels through the first segment boundary and the first groove corresponding to the first segment boundary. The distance between the edge of the organic layer in the packaging layer and the first segment boundary of the planarization layer is greater than the distance between the edge of the organic layer and the second segment boundary of the planarization layer. In other words, the first groove corresponding to the first segment boundary is provided with the organic layer and contains more organic layer material, such that a depth of the first groove corresponding to the first segment boundary is reduced to be less than an exposure depth. Therefore, a touch material residue of a touch material layer in the first groove generated during exposure and etching can be avoided, thereby reducing touch failure.

In embodiments of the present disclosure, the display region 1 is used for displaying a picture, and the display region includes a plurality of gate lines extending in a first direction and a plurality of data lines extending in a second direction perpendicular to the first direction. The plurality of gate lines and the plurality of data lines intersect to define a plurality of pixel regions, each pixel region is provided with a pixel, and each pixel has an organic light-emitting element, such as an organic light-emitting diode (OLED).

In embodiments of the present disclosure, the peripheral region 2 is configured to arrange a driving integrated circuit (IC) and the like. The pad region 5 is disposed at a side of the peripheral region 2 and is arranged corresponding to the first side 111 of the planarization layer 101. The pad region includes a plurality of pads 501, and each pad is electrically connected to a signal line extending from the display region. The pad 501 may be exposed on a surface of the pad region (i.e., it is not covered by any layer) so as to facilitate an electrical connection of the pad 501 to a flexible printed circuit board. The flexible printed circuit board is electrically connected to a controller to transmit signals or power from the controller. For example, the pad 501 and the touch signal line 1031 is electrically connected to achieve a communication between the touch signal line 1031 and the flexible printed circuit board.

In embodiments of the present disclosure, the touch signal line 1031 is electrically connected to the touch electrode pattern 1032 and the pad 501 of the pad region 5, respectively, such that the touch signal line 1031 transmits signals from the touch electrode pattern 1032 to the pad 501, further to the flexible printed circuit board, thereby realizing a touch function of the display panel.

Optionally, in embodiments of the present disclosure, the organic layer 121 is an inkjet printing layer. Hereinafter, the inkjet printing layer is taken as an example for exemplary description.

In an embodiment of the present disclosure, the first dam 201 is arranged around the display region 1. The first dam 201 blocks external water vapor or oxygen from entering the display region 1, and thus, components in the display region 1 are prevented from being affected, thereby avoiding affecting the display effect. At the same time, the first dam 201 also prevents the ink in the inkjet printing layer from overflowing, thereby ensuring the packaging effect.

In an embodiment of the present disclosure, the planarization layer 101 makes a surface of the display region 1 flatter, which on the one hand facilitates packaging, and on the other hand makes a light-emitting surface of the display panel flatter to ensure normal light emission, thereby improving the display effect.

Exemplarily, the planarization layer 101 is an insulation layer, and the insulation layer is made of one or more of polyimide, epoxy, acrylic, polyester and the like.

Referring again to FIG. 3, the planarization layer 101 may include a first planarization layer 114 and a second planarization layer 115. The first planarization layer 114 is disposed on the substrate 100, and the second planarization layer 115 is disposed on the first planarization layer 114. Two planarization layers are arranged to increase the planarization effect and facilitate the production thereof.

Exemplarily, the first planarization layer and the second planarization layer are made of the same material, or made of different materials, which is not limited in the present disclosure.

In an embodiment of the present disclosure, the packaging layer 102 packages a structure of the display panel from the substrate 100 to the planarization layer 101 to facilitate subsequent production of touch signal lines.

As shown in FIG. 3, the packaging layer 102 further includes a first inorganic packaging layer 122 and a second inorganic packaging layer 123, and the organic layer 121 is disposed between the first inorganic packaging layer 122 and the second inorganic packaging layer 123.

In this embodiment, the packaging layer 102 is arranged as a lamination of the first inorganic packaging layer 122, the organic layer 121, and the second inorganic packaging layer 123 to ensure the packaging effect.

Exemplarily, the first inorganic packaging layer 122 and the second inorganic packaging layer 123 are produced by a chemical vapor deposition (CVD) technology.

Exemplarily, the first inorganic packaging layer 122 and the second inorganic packaging layer 123 may be one of a silicon nitride layer, a silicon oxynitride layer, and a silicon oxide layer, or a laminated layer formed of multiple materials.

In an embodiment of the present disclosure, the organic layer 121 is disposed in the first dam 201, and the first inorganic packaging layer 122 and the second inorganic packaging layer 123 both cover the display region and the first dam.

As shown in FIG. 1, the touch electrode pattern 1032 includes a plurality of touch drive electrodes 131 and a plurality of touch sense electrodes 132 that are crosswise arranged, and intersections of touch drive electrodes 131 and the touch sense electrode 132 is insulated and separated by a touch insulation layer. Each of the touch drive electrodes 131 and each of the touch sense electrodes 132 are both correspondingly connected to one of the touch signal lines 1031.

In this embodiment, the touch drive electrodes 131 and the touch sense electrodes 132 are both connected to the pad 501 by the touch signal line 1031. The touch signal line 1031 transmits signals of the touch drive electrodes 131 and the touch sense electrodes 132 to the pad 501, and further to the flexible printed circuit board, thereby realizing the touch function of the display panel.

The touch drive electrodes 131 and the touch sense electrodes 132 are separated by a touch insulation layer, so as to prevent short circuits between electrodes and avoid affecting the touch function.

As shown in FIG. 1 and FIG. 3, the touch drive electrodes 131 and the touch sense electrodes 132 are disposed in a first touch sublayer 133, and both the touch drive electrodes 131 and the touch sense electrodes 132 include a plurality of electrode blocks. The electrode blocks of one of the touch drive electrodes 131 and the touch sense electrodes 132 are electrically connected through connecting blocks of the same layer; the electrode blocks of the other of the touch drive electrodes 131 and the touch sense electrodes 132 are connected by touch bridges 136 of different layers. The touch bridge 136 is disposed at a second touch sublayer 134, and the first touch sublayer 133 and the second touch sublayer 134 are insulated and separated by a touch insulation sublayer 135.

In other embodiments, the touch bridge 136 is disposed at the first touch sublayer 133, while the touch drive electrodes 131 and the touch sense electrodes 132 are disposed at the second touch sublayer 134. That is, the touch bridge 136 is closer to the substrate 100.

Exemplarily, the first touch sublayer 133 is a metal layer or an indium tin oxide (ITO) layer, so as to ensure the conductivity of the touch drive electrodes 131 and the touch sense electrodes 132 for transmitting electrical signals.

Exemplarily, the second touch sublayer 134 is a metal layer or an ITO layer to ensure the conductivity of the touch bridge 136 for transmitting electrical signals.

In embodiments of the present disclosure, the materials of the first touch sublayer 133 and the second touch sublayer 134 may be different or the same, which is not limited in the present disclosure.

Exemplarily, the touch insulation sublayer 135 is a laminated layer formed by one or more of a silicon oxide layer, a silicon nitride layer, or a silicon oxynitride layer to ensure the insulating effect of the touch insulation sublayer.

Referring again to FIG. 3, the display panel further includes a thin film transistor (TFT) array layer 104, and the planarization layer 101 is disposed on the thin film transistor array layer 104.

The TFT array layer 104 includes gate lines (not shown) and data lines (not shown), and the data lines are disposed in a source drain (SD) layer in the TFT array layer 104. The gate line and the data line extend from the display region 1 to the pad region 5 and travel through the second segment boundary 113. The gate line is electrically connected to the gate of the TFT and the driving IC, and the driving IC controls the switching of the TFT through the gate line and the gate. The data line is electrically connected to the source of the TFT and the driving IC, and the driving IC controls the voltage of the TFT through the data line and the source.

In embodiments of the present disclosure, the gate of the TFT is connected to the driving IC through the gate line, and the driving IC provides a driving signal to the gate of the TFT through the gate line. The gate line is arranged along an edge of the display region and extends from the display region 1 to the pad region 5. One of the source and drain of the TFT is connected to the data line, and the source and drain are connected to the driving IC through the data line. The driving IC writes a data signal into the data signal line through the data line, such that the display panel displays an image. The gate lines and data lines extend from the second segment boundary 113 of the first side to the pad region 5, such that the gate lines, data lines, and touch signal lines are more evenly distributed on the first side, which facilitates a trace layout.

Referring again to FIG. 2, the first side 111 of the planarization layer 101 includes a first segment ramp 112a and a second segment ramp 113a that are connected. A bottom side of the first segment ramp 112a is the first segment boundary 112, and a bottom side of the second segment ramp 113a is the second segment boundary 113. A height of the first segment ramp 112a is greater than a height of the second segment ramp 113a in a direction b perpendicular to the bearing surface of the substrate 100. The height of the first segment ramp 112a is a distance from a top surface of the first segment ramp 112a to a bottom surface of the substrate 100 in the direction perpendicular to the bearing surface of the substrate 100, and the height of the second segment ramp 113a is a distance from a top surface of the second segment ramp 113a to the bottom surface of the substrate 100 in the direction perpendicular to the bearing surface of the substrate 100. The bottom side of the first segment ramp 112a is a side of the first segment ramp 112a on a first surface of the planarization layer 101, the bottom side of the second segment ramp 113a is a side of the second segment ramp 113a on the first surface of the planarization layer 101, and the first surface of the planarization layer 101 is a surface thereof facing the substrate.

In this embodiment, the touch signal line 1031 travels through the first segment ramp 112a when extending from the display region 1 to the pad region 5, that is, the touch signal line 1031 travels through the first segment ramp 112a when extending from the higher planarization layer to the lower pad region 5. In the related art, since the first segment ramp 112a is relatively high, the first groove 3 corresponding to the first segment ramp 112a is deeper than an exposure depth, and thus, a touch material residue of the touch material layer may generate in the subsequent exposure and etching. In the embodiment of the present disclosure, the organic layer 121 is arranged in the first groove 3 corresponding to the first segment ramp 112a, such that the depth of the first groove 3 is reduced to be smaller than the exposure depth. Therefore, a touch material residue of the touch material layer in the first groove 3 generated during exposure and etching can be avoided, thereby reducing touch failure.

In the embodiment of the present disclosure, a height of the planarization layer corresponding to the first segment boundary 112 (that is, the height of the first segment ramp 112a) is greater than a height of the planarization layer corresponding to the second segment boundary 113 (that is, the height of the second segment ramp 113a). In the related art, when printing ink, it is easier for the ink to flow from the second segment boundary 113 into the first groove 3. Since the height of the planarization layer corresponding to the first segment boundary 112 is higher, it is difficult for the ink to flow from the first segment boundary 112 into the first groove 3, resulting in no printing ink in the first groove 3 corresponding to the first segment boundary 112. In contrast, in the solution according to the present disclosure, a range of the organic layer 121 is expanded, and a printing range at the first groove 3 is expanded outward. That is, when printing ink, the printing range is expanded into the first groove 3, and the expanded position corresponds to the first segment boundary 112 and is adjacent to the second segment boundary 113. With this special-shaped printing, the ink is directly printed into the first groove 3, thereby reducing the depth of the first groove 3 corresponding to the first segment boundary 112.

Exemplarily, the height of the planarization layer corresponding to the first segment boundary 112 falls within a range of 4.5 μm to 5 μm. For example, the height of the planarization layer corresponding to the first segment boundary 112 is 4.89 μm.

Exemplarily, the height of the planarization layer corresponding to the second segment boundary 113 falls within a range of 3.5 μm to 4 μm. For example, the height of the planarization layer corresponding to the second segment boundary 113 is 3.79 μm.

Referring again to FIG. 1, a distance between an edge of the first dam 201 opposite to the second segment boundary 113 and the second segment boundary 113 is less than a distance between an edge of the first dam 201 opposite to the first segment boundary 112 and the first segment boundary 112. The edge of the first dam 201 opposite to the second segment boundary 113 and the edge of the first dam 201 opposite to the first segment boundary 112 both refer to an edge, facing the display region, of the first dam 201 disposed at the same side of the display region as the first side 111.

In embodiments of the present disclosure, the second segment boundary 113 protrudes toward the first dam 201 relative to the first segment boundary 112, that is, the planarization layer 101 has a portion that protrudes toward the first dam and the second segment ramp 113a is disposed on the protruding portion. During a packaging process, the protruding portion of the planarization layer 101 may wrap the gate line and the data line to ensure that the gate line and the data line will not be damaged in subsequent production processes.

Exemplarily, an orthographic projection of the second segment ramp 113a, which projects outward, onto the bearing surface of the substrate 100 is rectangular.

In this embodiment, a slope angle of the first segment ramp 112a is greater than a slope angle of the second segment ramp 113a.

In other embodiments, the distance between the first segment boundary 112 and the first dam 201 may be equal to the distance between the second segment boundary 113 and the first dam 201, that is, the first segment boundary 112 and the second segment boundary 113 are arranged on a same line.

In some embodiments of the present disclosure, in the extending direction a of the edge of the first side 111, the length of the organic layer 121 between any one of the first segment boundaries 112 and the first dam 201 falls within a range of 1 mm to 3 mm.

In this embodiment, the length of the organic layer 121 between the first segment boundary 112 and the first dam 201 is defined, such that the organic layer 121 is disposed under each of the touch signal lines. Therefore, the generation of a touch material residue during the etching of the touch material layer is avoided, thereby reducing the touch failure.

In some embodiments of the present disclosure, the distance between the edge of the organic layer 121 and the first segment boundary 112 falls within a range of 50 μm to 150 μm.

In this embodiment, the organic layer 121 corresponding to the first segment boundary 112 is disposed in the first groove 3, and the area of the organic layer 121 in the first groove 3 corresponding to the first segment boundary 112 is relatively large by defining the distance between the edge of the organic layer 121 and the first segment boundary 112. Thus, a slope formed by the organic layer 121 is relatively gentle, and a resulted offset is reduced, thereby facilitating the etching of the touch layer.

Referring again to FIG. 1 and FIG. 2, the first side 111 of the planarization layer 101 includes two first segment boundaries 112. In the extending direction a of the edge of the first side 111, the two first segment boundaries 112 are respectively disposed at both sides of the second segment boundary 113.

In this embodiment, two first segment boundaries 112 are disposed at both sides of the second segment boundary 113, that is, the two first segment boundaries 112 are respectively disposed at both sides of the edge of the first side 111 of the planarization layer 101. In this way, the touch signal lines may respectively extend from the first segment boundaries 112 on both sides to the pad region 5 to be connected to the pad 501. On the one hand, it is convenient for producing touch signal lines; and on the other hand, it is ensured that the lengths of the touch signal lines on both sides of the display panel are equivalent, such that the resistance difference of the touch signal lines is small, and the size difference of the touch signals at different positions of the display panel is eliminated, thereby avoiding affecting the touch effect.

In embodiments of the present disclosure, in the inkjet printing process, a printing region can be defined according to computer aided design (CAD) drawings, and an inkjet printing region can be flexibly adjusted according to an actual ink flow effect. Therefore, the printing process can be improved in time, and a cost is lower than that of a mask for directly changing the planarization layer.

In some embodiments of the present disclosure, in the inkjet printing process, an automatic optical inspection (AOI) technology can be employed to timely monitor a situation that the ink covers an edge of the planarization layer. According to a monitoring result, a coverage situation of a corresponding region can be adjusted in time, which ensures the yield rate of the display panel.

Figure 4:
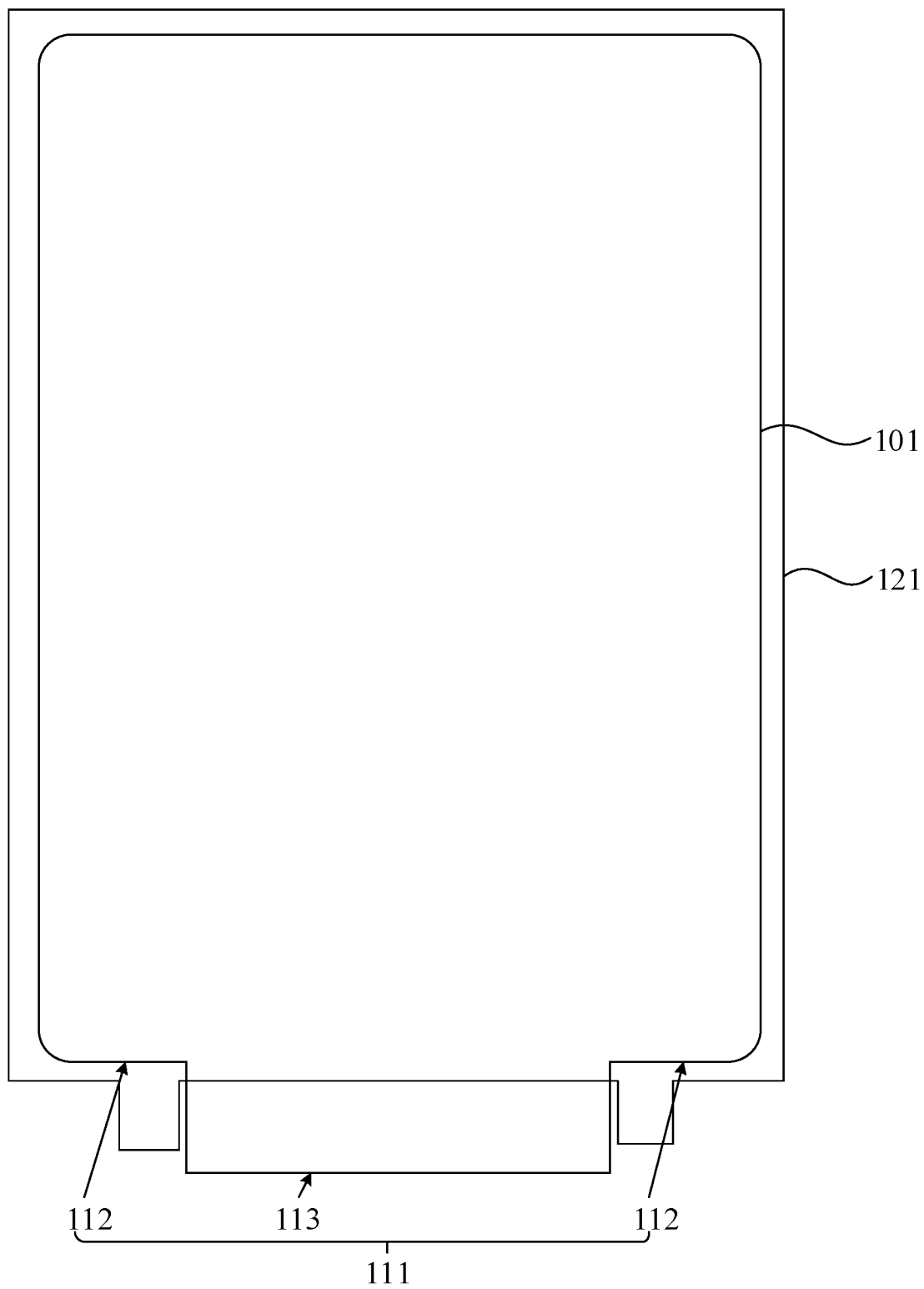
FIG. 4 is a schematic diagram of a printing pattern according to an embodiment of the present disclosure.

FIG. 4 is a schematic diagram of a printing pattern according to an embodiment of the present disclosure. Referring to FIG. 4, the organic layer is expanded outward in printing, only at a position (that is, the two protruding parts in FIG. 4) corresponding to the first segment boundaries 112, so as to prevent a range of the organic layer from being too large and causing an ink overflow. Specifically, since the height of the planarization layer corresponding to the first segment boundary 112 is relatively high, the ink volume will increase when printing ink if the range of the organic layer is too large, in this way, more ink will flow into the first groove 3 corresponding to the second segment boundary 113 and the ink will overflow out of the first dam, resulting in a packaging failure.

As shown in FIG. 4, the region expanded outward in printing is two rectangles respectively arranged corresponding to the two first segment boundaries 112. Due to the fluidity, the ink will flow to the outside of the printed pattern, eventually forming a boundary of the organic layer 121 as shown in FIG. 1.

In the present disclosure, a special-shaped printing is only performed on parts prone to a touch material residue, such that the ink may overflow out of the planarization layer without affecting a staying position of the ink in other regions, thereby significantly reducing an offset of a climbing region (i.e., the first ramp 6) and improving the touch material residue at this location.

Figure 5:
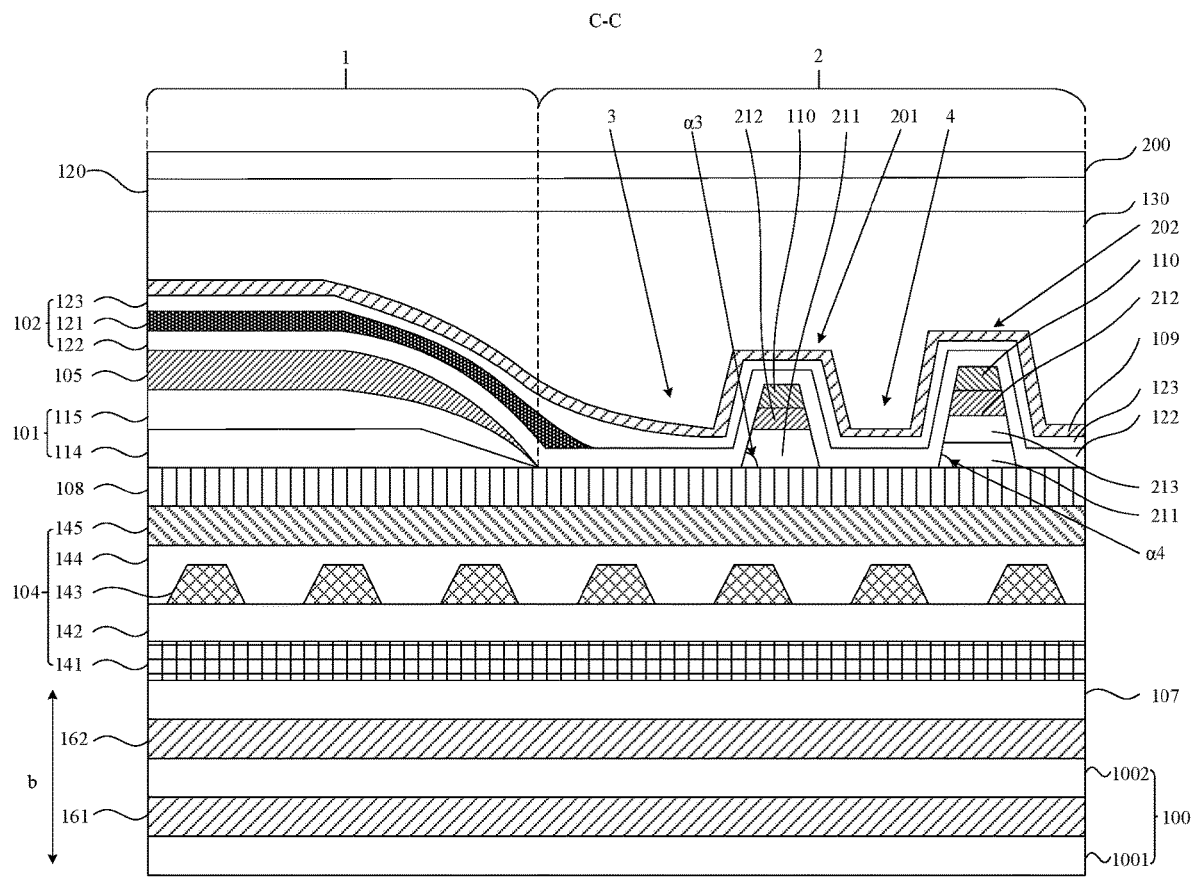
FIG. 5 is a schematic diagram of a cross section of the C-C plane in FIG. 1.

FIG. 5 is a schematic diagram of a cross section of the C-C plane in FIG. 1. Referring to FIG. 5, in the extending direction a of the edge of the first side 111, a portion, proximal to the first dam 201, of the first segment boundary 112 is not provided with an expanded printing region. Therefore, a boundary of the organic layer 121 in this portion is closer to a boundary of the display region 1.

Figure 6:
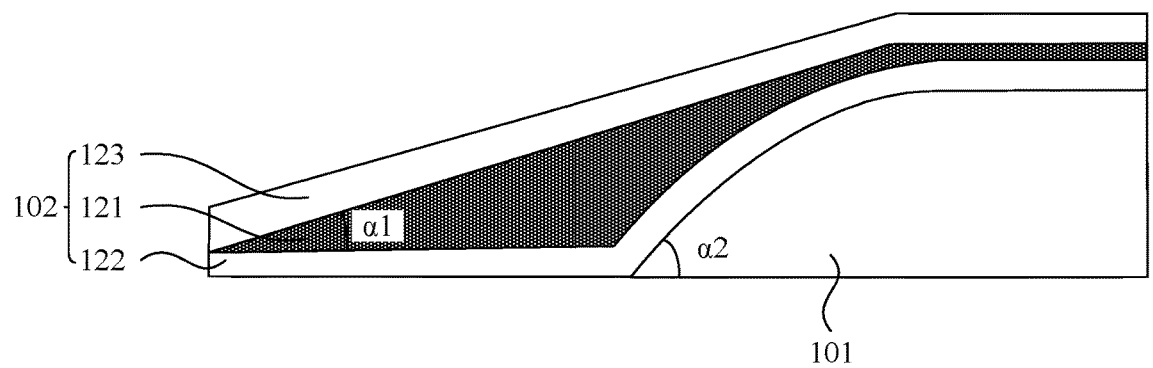
FIG. 6 is a schematic view of a slice in a first groove according to an embodiment of the present disclosure.

FIG. 6 is a schematic view of a slice in a first groove according to an embodiment of the present disclosure. Referring to FIG. 6, the organic layer 121 between the first segment boundary 112 and the first dam 201 forms a first ramp 6, and a slope angle α1 of the first ramp 6 falls within a range of 1 degree to 35 degrees.

In this embodiment, after the organic layer 121 is produced, the slope angle α1 of the first ramp 6 formed by the organic layer 121 between the first segment boundary 112 and the first dam 201 is relatively gentle, such that an offset between the first groove 3 and the packaging layer is reduced, which facilitates a layout of traces of the touch layer at this location; at the same time, a depth of the first groove 3 is reduced, which facilitates subsequent etching of the touch layer, and avoids the presence of touch material residues causing a touch failure.

Optionally, in the embodiment of the present disclosure, the slope angle α1 of the first ramp 6 falls within a range of 10 degrees to 15 degrees.

As shown in FIG. 6, the first groove 3 is provided with an organic layer, such that the depth of the first groove 3 becomes smaller, which facilitates subsequent etching of the touch layer.

Exemplarily, the slice diagram shown in FIG. 6 may be a focused ion beam (FIB) slice diagram.

Referring again to FIG. 3, the display panel in the display region 1 further includes a first pixel definition layer (PDL) 105 on the second planarization layer 115. The first planarization layer 114 and the second planarization layer 115 corresponding to the first segment boundary 112, and a portion, proximal to the first dam 201, of the first pixel definition layer 105 define a second ramp 7, and edges of the first planarization layer 114 and the second planarization layer 115 corresponding to the first segment boundary 112 are overlapped with the edge of the first pixel definition layer 105.

The second planarization layer 115 and the portion, proximal to the first dam 201, of the first pixel definition layer 105 defines a second ramp 7, such that a transition between the first pixel definition layer 105 and a bottom side of the first groove 3 is gentle, which facilitates subsequent etching of the touch layer.

In some embodiments of the present disclosure, the slope angle α2 of the second ramp 7 falls within a range of 35 degrees to 55 degrees.

In this embodiment, the angle range of the slope angle α2 of the second ramp 7 is defined in such a range, on the one hand, it is ensured that the transition between the first pixel definition layer 105 and the bottom side of the first groove 3 is gentle; on the other hand, the second ramp 7 is not too gentle to avoid an excessively large peripheral region, which is not conducive to a narrow frame design of the display panel.

As shown in FIG. 2, a height of the planarization layer 101 proximal to the second segment boundary 113 is less than a height of the planarization layer 101 proximal to the first segment boundary 112, that is, the planarization layer 101 proximal to the second segment boundary 113 is formed with a groove. Correspondingly, a height of the first pixel definition layer 105 corresponding to the first segment boundary 112 is greater than a height of the first pixel definition layer 105 corresponding to the second segment boundary 113, that is, the first pixel definition layer 105 is also formed with a groove. Since the ink in the organic layer 121 has fluidity, more ink will be deposited in the grooves, such that the surface of the organic layer is flat and the surface of the packaging layer 102 in the display region 1 is flat.

Figure 7:
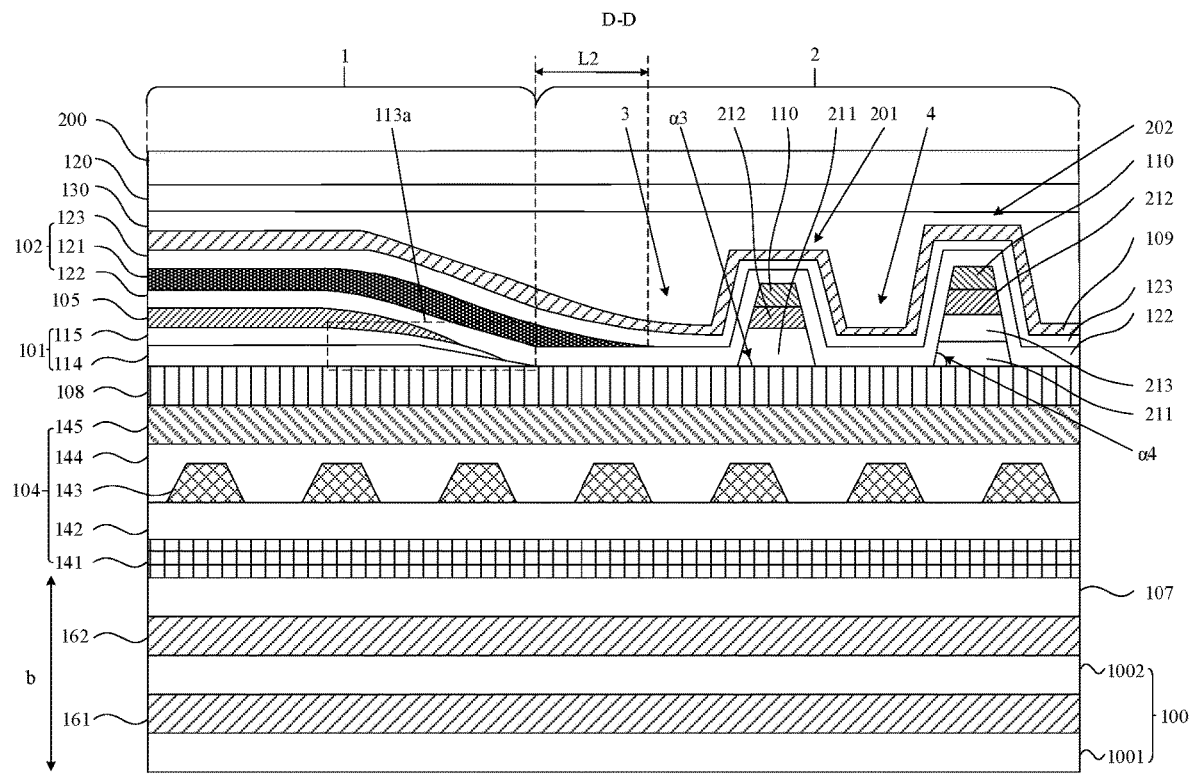
FIG. 7 is a schematic diagram of a cross section of the D-D plane in FIG. 1.

FIG. 7 is a schematic diagram of a cross section of the D-D plane in FIG. 1. Referring to FIG. 7, a distance between an edge of the first dam 201 opposite to the second segment boundary 113 and the second segment boundary 113 is less than a distance between the edge of the first dam 201 opposite to the second segment boundary 113 and an edge of the first pixel definition layer 105 opposite to the second segment boundary 113. An edge of the first pixel definition layer 105 opposite to the first side 111 refers to an edge, facing the display region, of the first pixel definition layer 105 disposed at the same side of the display region as the first side 111.

In this embodiment, since the second segment boundary 113 protrudes toward the first dam 201 relative to the first segment boundary 112, the edge of the first pixel definition layer 105 may be retracted toward the display region 1, such that the planarization layer 101 corresponding to the second segment boundary 113 and the first pixel definition layer 105 form a gentle ramp. When printing, the ink may flow from a boundary of the second segment boundary 113 into the first groove 3 more easier, such that the first groove 3 corresponding to the second segment boundary 113 also contains printing ink. In this way, the depth of the first groove 3 corresponding to the second segment boundary 113 becomes shallower, which facilitates subsequent film production.

In the embodiment of the present disclosure, since a thickness of the ink in the first groove 3 corresponding to the second segment boundary 113 is relatively high, after the organic layer 121 is produced, the slope angle of the first ramp 6 is smaller than that of a ramp formed by the organic layer 121 between the second segment boundary 113 and the first dam 201. The slope angle of the first ramp 6 is formed by the organic layer 121 between the first segment boundary 112 and the first dam 201.

Referring again to FIG. 1, FIG. 3 and FIG. 7, the display panel further includes a second dam 202. The second dam 202 is disposed in the peripheral region 2 and surrounds the first dam 201. A groove 4 is defined between the first dam 201 and the second dam 202. A height of the second dam 202 is greater than that of the first dam 201, and a distance between the first surface of the planarization layer 101 and a second surface of the first pixel definition layer 105 is greater than the height of the second dam 202. The height of the first dam 201 is a distance between a top surface, distal from the substrate 100, of the first dam 201 and the first surface of the planarization layer 101 in the direction b perpendicular to the bearing surface of the substrate 100, and the height of the second dam 202 is a distance between a top surface, distal from the substrate 100, of the second dam 202 and the first surface of the planarization layer 101 in the direction b perpendicular to the bearing surface of the substrate 100. The first surface of the planarization layer 101 is a surface, proximal to the substrate 100, of the planarization layer 101, and the second surface of the first pixel definition layer 105 is a surface, distal from the substrate, of the first pixel definition layer 105.

In this embodiment, the second dam 202 is arranged on the display panel. The second dam 202 may likewise prevent external water vapor or oxygen from entering the display region 1. By arranging the first dam and the second dam at the same time, a blocking effect on water and oxygen can be enhanced and the water and oxygen corrosion can be avoided, otherwise they may affect components in the display region 1 and in turn affect the display effect.

In the related art, the exposure depth is generally defined by a depth of the second groove 4 (i.e., a distance from the bottom of the second groove 4 to the top of the first dam 201). Since the height of the first pixel definition layer 105 is greater than the height of the second dam 202 such that the depth of the first groove 3 is greater than the depth of the second groove 4, a touch material residue is generated when the touch material layer is exposed and etched. In the present disclosure, the first groove 3 is disposed with the organic layer, so as to reduce the depth of the first groove 3 and cause the depth of the first groove 3 to be less than the exposure depth. In this way, no touch material residue will be generated when the touch material layer is exposed and etched, and short circuit (which will cause touch failure) between touch signal lines will be avoided.

In the embodiment of the present disclosure, when the display panel is provided with the second dam 202, the first inorganic packaging layer 122 and the second inorganic packaging layer 123 both cover the display region, the first dam 201 and the second dam 202.

Referring again to FIGS. 3 and 7, the first dam 201 includes a third planarization layer 211, a second pixel definition layer 212, and a photo spacer (PS) layer 110 that are sequentially laminated, and the second dam 202 includes a third planarization layer 211, a fourth planarization layer 213, the second pixel definition layer 212 and the photo spacer layer 110 that are sequentially laminated. The third planarization layer 211 and the first planarization layer 114 are disposed at a same layer, the fourth planarization layer 213 and the second planarization layer 115 are disposed at a same layer, and the second pixel definition layer 212 and the first pixel definition layer 105 are disposed at a same layer. Where "being disposed at a same layer" means that: forming a film layer with a specific pattern by employing a same film forming process, and forming a layer structure by performing a one-time patterning process with a same mask on the film layer. Depending on the specific pattern, the same patterning process may include multiple exposure, development or etching processes, and resulted specific patterns in the formed layer structure may be continuous or discontinuous, and these specific patterns may be disposed at different heights or may have different thicknesses.

In this embodiment, the third planarization layer 211 is disposed at the same layer as the first planarization layer 114, and the fourth planarization layer 213 is disposed at the same layer as the second planarization layer 115. During production, two planarization films is produced first, and then by a patterning process, the first planarization layer 114 and the second planarization layer 115 are formed in the display region while the third planarization layer 211 and the fourth planarization layer 211 are formed in the peripheral region, respectively. Then a layer of pixel definition film is produced, and by a patterning process, a first pixel definition layer 105 is formed in the display region, a second pixel definition layer 212 is formed on the third planarization layer 211 in the peripheral region and the first dam 201 is composed, and a second pixel definition layer 212 is formed on the third planarization layer 211 and the fourth planarization layer 213 in the peripheral region and the second dam 202 is composed. In this manufacturing method, the third planarization layer 211 is formed when the first planarization layer 114 is produced, the fourth planarization layer 213 is formed when the second planarization layer 115 is produced, and the second pixel definition layer 212 is formed when the first pixel definition layer 105 is produced, and finally the first dam 201 and the second dam 202 are formed, which is convenient for manufacturing.

In the embodiment of the present disclosure, the material of the third planarization layer 211 is the same as the material of the first planarization layer 114. The material of the fourth planarization layer 213 is the same as the material of the second planarization layer 115. The material of the second pixel definition layer 212 is the same as the material of the first pixel definition layer 105.

In the embodiment of the present disclosure, the photo spacer layer 110 is disposed on the second pixel definition layer 212 so as to ensure the heights of the second dam 202 and the first dam 201.

In the embodiment of the present disclosure, the pixel region of the display region 1 of the display panel may also be provided with the photo spacer layer 110 for supporting a mask when the organic light-emitting layer is evaporated.

In some embodiments of the present disclosure, a difference between the height of the second dam 202 and the height of the first dam 201 falls within a range of 0.4 μm to 1.0 μm.

In this embodiment, the height of the first dam 201 is defined to be slightly shorter than the height of the second dam 202, such that the blocking effect of the first dam 201 is prevented from being affected by too large height difference between the first dam 201 and second dam 202.

Exemplarily, the height of the first dam 201 falls within a range of 3.0 μm to 4.0 μm, for example, the height of the first dam 201 is 3.47 μm.

Exemplarily, the height of the second dam 202 falls within a range of 3.5 μm to 4.5 μm, for example, the height of the second dam 202 is 4.0 μm.

Referring again to FIG. 2 and FIG. 3, both the first dam 201 and the second dam 202 have ramps. A slope angle α3 of a ramp of a side of the first dam 201 (i.e., a taper angle of the first dam) falls within a range of 15 degrees to 50 degrees, and a slope angle α4 of a ramp of a side of the second dam 202 (i.e., a taper angle of the second dam) falls within a range of 15 degrees to 50 degrees.

For example, the taper angle α3 of the ramp of the first dam 201 is 46.37 degrees, and the taper angle α4 of the ramp of the second dam 202 is 45 degrees. By setting the above angles, it is convenient for touch signal lines to travel through the first dam and the second dam.

In an embodiment of the present disclosure, in the display region, the TFT array layer 104, the planarization layer 101, the first pixel definition layer 105, the photo spacer layer (not shown in FIG. 3), the light-emitting layer (not shown in FIG. 3), the packaging layer 102 and the touch layer 103 are laminated on the substrate 100. The light-emitting layer is disposed in a groove of the first pixel definition layer 105 for light-emitting display of the display panel.

In the embodiment of the present disclosure, in the peripheral region, the TFT array layer 104, the third planarization layer 211, the fourth planarization layer 213, the second pixel definition layer 212, the photo spacer layer 110, the packaging layer 102 and the touch layer 103 are laminated on the substrate 100.

In this embodiment, the substrate 100 provides support for an internal structure of the display panel. The TFT array layer 104 forms a TFT structure for controlling the display panel to display a picture.

In the embodiments of the present disclosure, the light emitting layer includes an anode layer, an electron transport layer, an organic light emitting layer, a hole transport layer and a cathode layer that are laminated, wherein the anode layer, the electron transport layer, the organic light emitting layer, and the hole transport layer are arranged in the groove formed by the pixel definition layer, and the cathode layer covers the pixel definition layer.

In an embodiment of the present disclosure, the display panel further includes a polarizer 120 and a cover plate 200 laminated on the touch layer 103.

In this embodiment, the cover plate 200 protects the internal structure of the display panel. The polarizer 120 changes a polarization direction of light, such that interference light in the display panel is filtered out, thereby ensuring the display effect.

Exemplarily, a filling layer 130 is provided on the touch layer 103, and the filling layer 130 makes a surface of the touch layer 103 flat for easily arranging the polarizer 120.

Exemplarily, the cover plate 200 is a glass cover plate or a transparent plastic cover plate, thereby ensuring the light transmittance of the cover plate 200.

Referring again to FIG. 2, FIG. 3, FIG. 5 and FIG. 7, the substrate 100 includes a first substrate 1001 and second substrate 1002. The first substrate 1001 is provided with a first barrier layer 161, and the second substrate 1002 is provided with a second barrier layer 162.

In the embodiment of the present disclosure, a barrier layer is formed on the substrate, and the insulation layer is formed by the barrier layer for preventing external static electricity from affecting the internal circuit of the display panel. At the same time, the barrier layer can also block the diffusion of heat into the display panel so as to avoid damage to the display panel due to high temperature.

Two barrier layers are provided for ensuring the insulating effect of the barrier layer. At the same time, the first barrier layer 161 and the second barrier layer 162 are respectively disposed on two substrates. In this way, when a surface of a substrate is not flat, the first barrier layer 161 may improve the surface flatness of the first substrate 1001, and the second barrier layer 162 may improve the surface flatness of the second substrate 1002. The adhesion of the first barrier layer 161 is great, which facilitates the adhesion of the first substrate 1001 and the second substrate 1002.

In the embodiments of the present disclosure, the substrate is a flexible substrate, and the flexible substrate is made of a flexible organic material, such as polyimide (PI), polycarbonate, polyacrylate, polyetherimide, polyethersulfone, polyethylene terephthalate, polyethylene naphthalate and other resin materials.

In an embodiment of the present disclosure, the first barrier layer 161 and the second barrier layer 162 may include an inorganic material of silicon oxide, silicon nitride, or silicon oxynitride, and may be formed as a multilayer or a single layer.

Optionally, the display panel further includes a buffer layer 107 disposed on the second barrier layer 162. The TFT array layer 104 is disposed on the buffer layer 107.

The buffer layer 107 separates the barrier layer and the TFT array layer 104 for preventing the barrier layer from affecting the operation of the TFT array layer 104, and for facilitating the production of the TFT array layer 104.

Exemplarily, the buffer layer 107 may be a silicon oxide layer, a silicon nitride layer, or a silicon oxynitride layer, or a lamination of any two or three from the silicon oxide layer, the silicon nitride layer, and the silicon oxynitride layer, so as to ensure the insulation effect of the buffer layer 107.

Optionally, the TFT array layer 104 includes an active layer 141, a gate insulation (GI) layer 142, a gate layer 143, an inter-layer dielectric layer 144, and an SD layer 145. The TFTs shown in FIG. 3 and FIG. 5 are just examples, and the display panel may also include TFTs of other structures.

In the embodiment of the present disclosure, the gate insulation layer 142 is disposed between the active layer 141 and the gate layer 143, such that the active layer 141 and the gate layer 143 are separated by the gate insulation layer 142. In this way, the active layer 141 and the gate layer 143 separated from each other may independently transmit signals. The inter-layer dielectric layer 144 is disposed between the gate layer 143 and the SD layer 145, such that the gate layer 143 and the SD layer 145 may independently transmit signals.

Exemplarily, the active layer 141 is a low temperature polycrystalline-silicon (LTPS) layer. LTPS has high mobility and good stability and may meet requirements of high-resolution displays.

Exemplarily, each of the gate insulation layer 142 and the inter-layer dielectric layer 144 is an inorganic insulation layer, such as a silicon nitride layer or a silicon oxynitride layer, or an organic insulation layer, such as a ring-shaped resin insulation layer. The insulating properties of the silicon nitride, the silicon oxynitride, and the ring-shaped resin are good, such that the insulating properties of the gate insulation layer 142 and the inter-layer dielectric layer 144 are ensured. The materials of the gate insulation layer 142 and the inter-layer dielectric layer 144 may be the same or different.

In an embodiment of the present disclosure, each of the gate layer 143 and the SD layer 145 is a metal layer or an ITO layer, such that the stability of the electrical signal transmission between the gate layer 143 and the SD layer 145 is ensured.

Optionally, the display panel further includes an insulation layer (PVX) layer 108 on the SD layer 145. The PVX layer 108 separates the SD layer 145 and the anode layer disposed in the first pixel definition layer 105, such that the SD layer 145 and the anode layer independently transmits signals.

Optionally, the display panel further includes a third barrier layer 109 on the packaging layer 102. By arranging barrier layers on opposite sides of the display panel, the blocking effect for water and oxygen is increased.

In an embodiment of the present disclosure, the third barrier layer 109 may include an inorganic material of silicon oxide, silicon nitride, or silicon oxynitride, and may be formed as a multilayer or a single layer.

Figure 8:
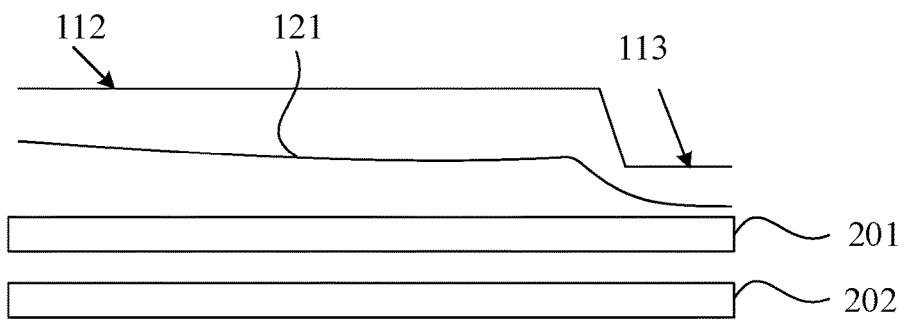
FIG. 8 is a printing effect diagram of a first side of a display panel according to an embodiment of the present disclosure.
Figure 9:
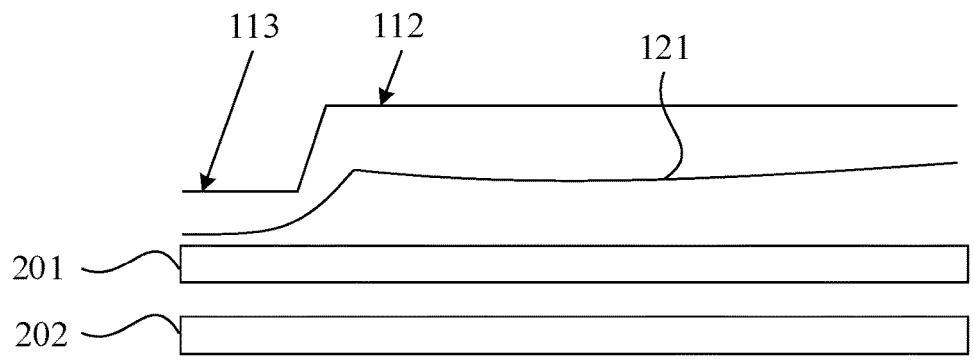
FIG. 9 is a printing effect diagram of a first side of a display panel according to another embodiment of the present disclosure.

FIG. 8 is a printing effect diagram of a first side of a display panel according to an embodiment of the present disclosure. FIG. 9 is a printing effect diagram of a first side of a display panel according to another embodiment of the present disclosure. Referring to FIG. 8 and FIG. 9, a boundary of the organic layer 121 is disposed in the first groove and does not exceed a boundary of the first dam 201, which can reduce a depth of the first groove and avoid a package failure.

Figure 10:
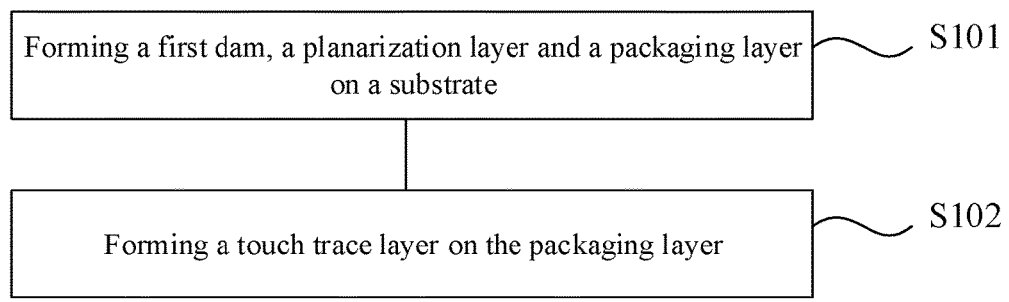
FIG. 10 is a flowchart for manufacturing a display panel according to an embodiment of the present disclosure.

FIG. 10 is a flowchart for manufacturing a display panel according to an embodiment of the present disclosure. Referring to FIG. 10, the method includes:

In S101, a first dam, a planarization layer and a packaging layer are formed on a substrate.

The substrate includes a display region, a peripheral region surrounding the display region, and a pad region disposed at a side, distal from the display region, of the peripheral region. The first dam is disposed in the peripheral region and surrounds the display region. The planarization layer is disposed within the first dam. A first groove is defined between the first dam and the planarization layer, and an edge of a first side of the planarization layer, along an extending direction of the edge of the first side, includes a first segment boundary and a second segment boundary that are connected, and the first side and the pad region are disposed on a same side of the display region. The packaging layer includes an organic layer, and a distance between an edge of the organic layer and the first segment boundary of the planarization layer is greater than a distance between the edge of the organic layer and the second segment boundary.

FIG. 11 to FIG. 15 are diagrams of a manufacturing process of a display panel according to the present disclosure. The method for manufacturing a display panel according to the present disclosure is introduced below with reference to FIG. 11 to FIG. 15.

Exemplarily, the S101 may include the following steps.

In a first step: a substrate is provided.

Figure 11:
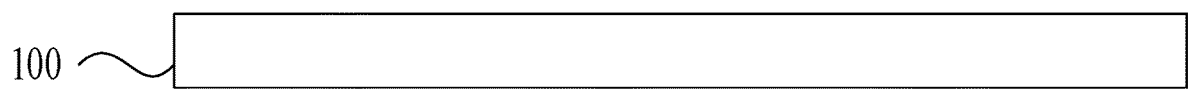
FIGS. 11-15 show a manufacturing process diagram of a display panel according to the present disclosure.

Referring to FIG. 11, a substrate 100 is provided. The substrate 100 may be a transparent substrate, such as a glass substrate, a plastic substrate, etc.

In a second step: a barrier layer and a buffer layer are sequentially produced on the substrate.

Figure 12:
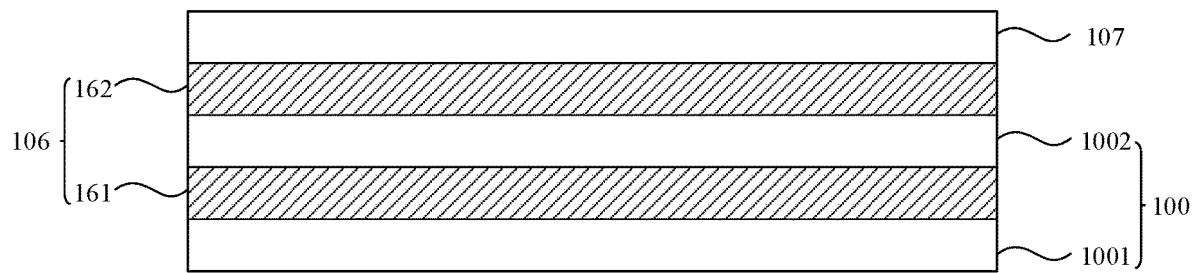

Referring to FIG. 12, a barrier layer 106 and a buffer layer 107 are sequentially produced on the substrate 100.

Exemplarily, a first barrier layer 161 is produced on the first substrate 1001 by an evaporation process; a second substrate 1002 is covered on the first barrier layer 161 after the first barrier layer 161 has been formed; and a second barrier layer 162 is formed on the second substrate 1002; and then a buffer layer 107 is produced on the second barrier layer 162 by an evaporation process.

Exemplarily, each of the first barrier layer 161 and the second barrier layer 162 may include an inorganic material of silicon oxide, silicon nitride, or silicon oxynitride, and may be formed as a multilayer or a single layer.

Exemplarily, the buffer layer 107 is a silicon oxide layer, a silicon nitride layer, or a silicon oxynitride layer, or a lamination of any two or three from the silicon oxide layer, the silicon nitride layer, and the silicon oxynitride layer, so as to ensure the insulation effect of the buffer layer 107.

In a third step: a TFT array layer is formed on the buffer layer.

Figure 13:
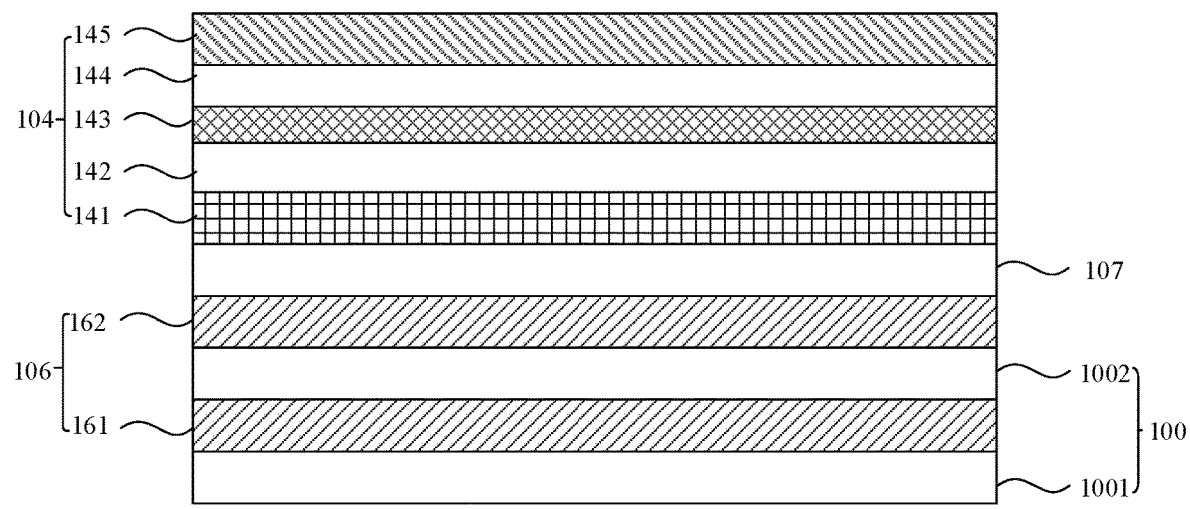

Referring to FIG. 13, a TFT array layer 104 is formed on the buffer layer 107.

This step may include: sequentially forming an active layer 141, a gate insulation layer 142, a gate layer 143, an inter-layer dielectric layer 144 and an SD layer 145 on the buffer layer 107.

Exemplarily, the active layer 141 is a polycrystalline-silicon layer or a monocrystalline-silicon layer.

Exemplarily, each of the gate insulation layer 142 and the inter-layer dielectric layer 144 may be an inorganic insulation layer, such as a silicon nitride layer or a silicon oxynitride layer, or an organic insulation layer, such as a ring-shaped resin insulation layer. The insulating properties of silicon nitride, silicon oxynitride, and ring-shaped resin are good, such that the insulating properties of the gate insulation layer 142 and the inter-layer dielectric layer 144 are ensured. The materials of the gate insulation layer 142 and the inter-layer dielectric layer 144 may be the same or different.

Exemplarily, each of the gate layer 143 and the SD layer 145 may be a metal layer or an ITO layer, such that the stability of the electrical signal transmission between the gate layer 143 and the SD layer 145 is ensured.

Exemplarily, the active layer 141 is first formed on the buffer layer 107 by the evaporation process; the gate insulation layer 142 is formed on the active layer 141 by the evaporation process; the gate layer 143 is formed on the gate insulation layer 142 by a sputtering process; the inter-layer dielectric layer 144 is formed on the gate layer 143 by the evaporation process; and finally the SD layer 145 is formed on the inter-layer dielectric layer 144 by the sputtering process.

In a fourth step: a planarization layer and a packaging layer are sequentially formed on the TFT array layer.

Figure 14:
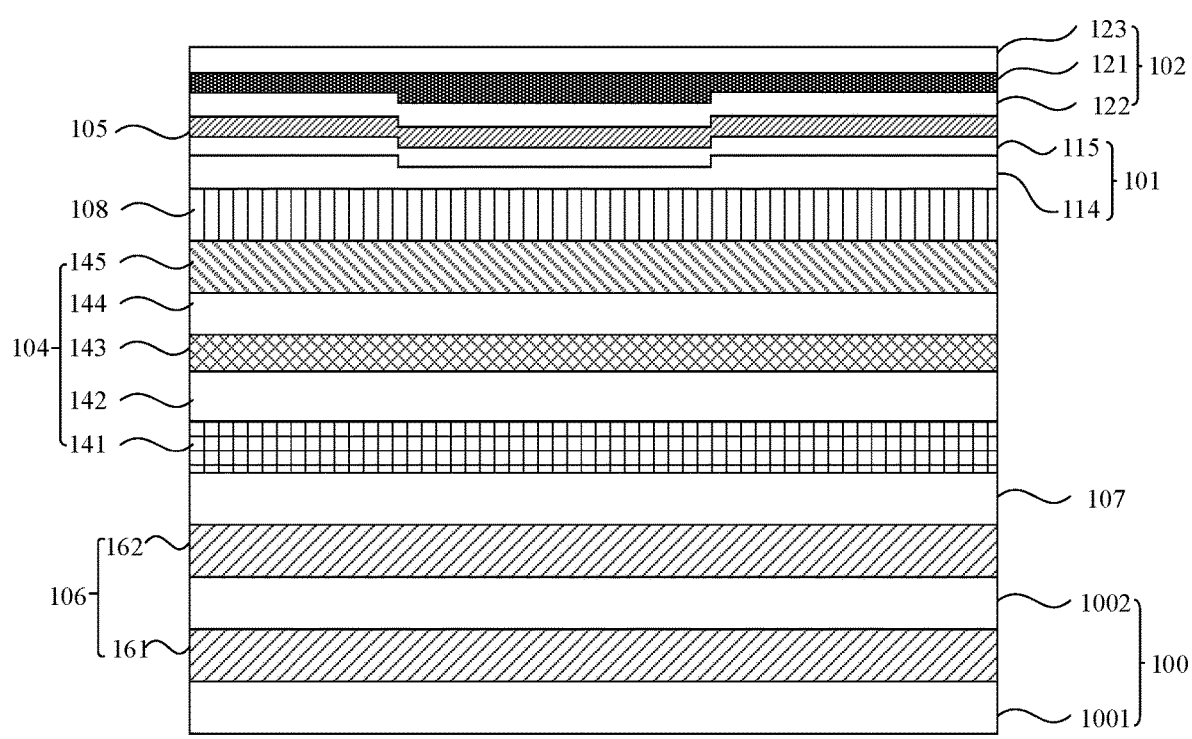

Referring to FIG. 14, a PVX layer 108 is first formed on the TFT array layer 104, and then a planarization layer 101, a first pixel definition layer 105 and a packaging layer 102 is formed on the PVX layer 108.

Exemplarily, the planarization layer 101 is an insulation layer, and the material of the insulation layer is one or more of polyimide, epoxy, acrylic, polyester and other materials.

Exemplarily, the planarization layer 101 may include a first planarization layer 114 disposed on the substrate 100 and a second planarization layer 115 disposed on the first planarization layer 114. By arranging two planarization layers, the planarization effect is enhanced.

In the embodiment of the present disclosure, two planarization films are produced first, and then by a patterning process, the first planarization layer 114 and the second planarization layer 115 are formed in the display region and the third planarization layer 211 and the fourth planarization layer 211 are formed in the peripheral region, respectively. Then a layer of pixel definition film is produced, and by a patterning process, a first pixel definition layer 105 is formed in the display region, a second pixel definition layer 212 is formed on the third planarization layer 211 in the peripheral region and the first dam 201 is composed, and a second pixel definition layer 212 is formed on the third planarization layer 211 and the fourth planarization layer 213 in the peripheral region and the second dam 202 is composed.

Then a first inorganic packaging layer 122, an organic layer 121 and a second inorganic packaging layer 123 are sequentially formed on the pixel definition layer.

In the embodiment of the present disclosure, after the first pixel definition layer 105 is formed, a light emitting layer is formed in a groove of the first pixel definition layer 105.

Exemplarily, a first inorganic packaging layer 122 is formed on the pixel definition layer by a CVD process, the organic layer 121 is produced on the first inorganic packaging layer 122 by an inkjet printing process, and then the second inorganic packaging layer 123 is produced on the organic layer 121 by the CVD process.

Exemplarily, when forming the organic layer, a printing region is first defined through CAD drawings based on a size of a backplane before printing.

In S102: a touch layer is formed on the packaging layer. The touch layer includes touch signal lines and a touch electrode pattern, one end of the touch signal line is electrically connected to the touch electrode pattern, and the other end of the touch signal line extends from the display region to the pad region and travels through the first segment boundary, and is electrically connected to the pad in the pad region.

Figure 15:
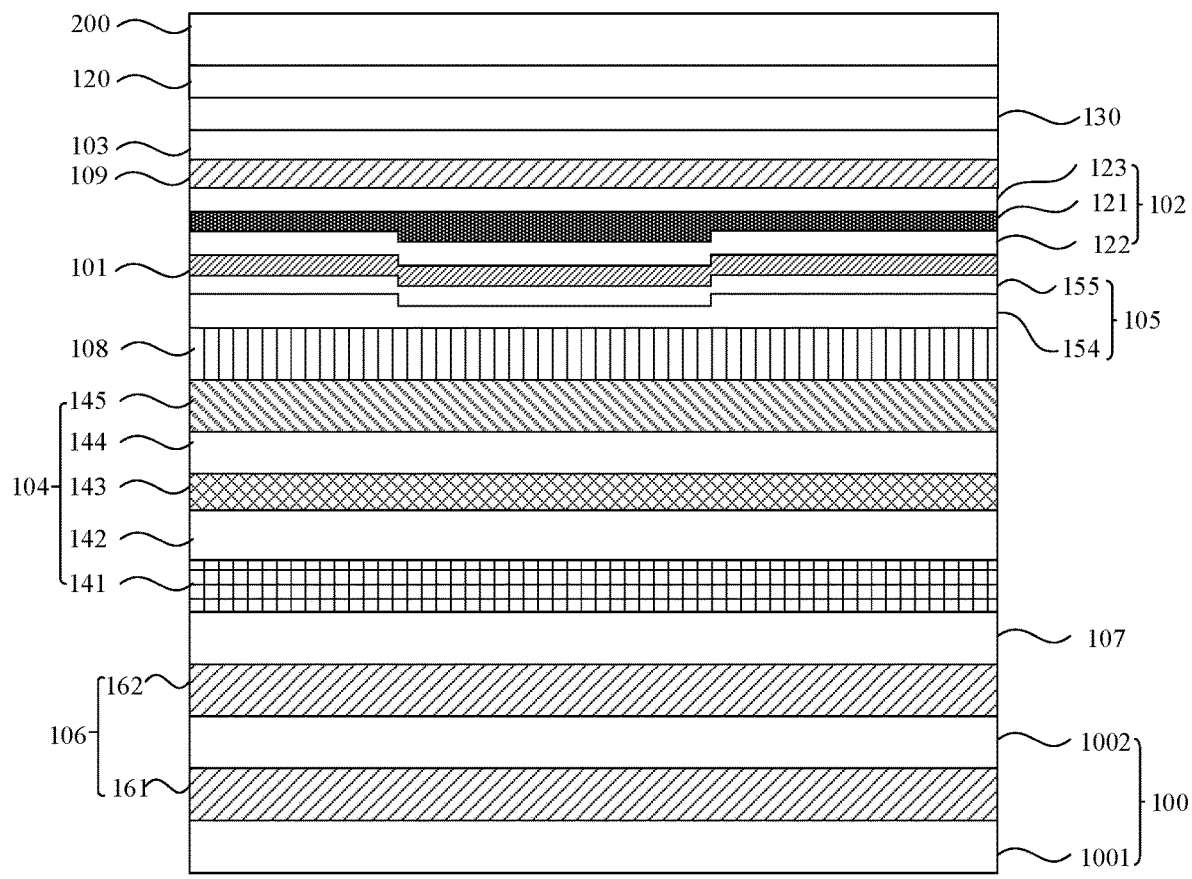

Referring to FIG. 15, the third barrier layer 109 is formed first on the packaging layer 102, and then the touch layer 103 is formed on the third barrier layer 109. The touch layer 103 includes touch signal lines and a touch electrode pattern.

Exemplarily, the third barrier layer 109 is formed on the packaging layer 102 by the CVD process, then a first touch signal line film layer is formed on the packaging layer 102, and the first touch signal line film layer is patterned to form a first touch sublayer. The first touch sublayer includes a touch bridge. A touch insulation sublayer is formed on the first touch sublayer, then a second touch signal line film layer is formed on the touch insulation sublayer, and the second touch signal line film layer is patterned to form a second touch sublayer. The second touch sublayer includes a plurality of touch drive electrodes and a plurality of touch sense electrodes that are crosswise arranged, and the intersections of the touch drive electrodes and the touch sense electrodes is insulated and separated by a touch insulation layer. Finally, the touch layer 103 is formed. Then a subsequent module assembly operation is performed, the polarizer 120 is attached to the touch layer 103, and the cover plate 200 is covered on the polarizer 120 so as to form a display panel.

An embodiment of the present disclosure further provides a display device, which includes any one of the above display panels.

In specific embodiments, the display device provided by the embodiments of the present disclosure may be any product or component with a display function, such as a mobile phone, a tablet computer, a television, a display, a notebook computer, a digital photo frame, a navigator, etc.

The above-mentioned are only preferred embodiments of the present disclosure and are not intended to limit the present disclosure. Any modification, equivalent replacement, improvement, etc. made within the spirit and principle of the present disclosure shall be included in the protection scope of the present disclosure.

What is claimed is:

1. A display panel, comprising:
   a substrate comprising:
     a display region,
     a peripheral region surrounding the display region, and
     a pad region disposed on a side, distal from the display region, of the peripheral region,
   a first dam disposed in the peripheral region and surrounding the display region;
   a planarization layer disposed within the first dam, wherein a first groove is defined between the first dam and the planarization layer, and wherein an edge of a first side of the planarization layer, along an extending direction of the edge of the first side, comprises a first segment boundary and a second segment boundary that are connected, and the first side and the pad region are disposed on a same side of the display region;
   a packaging layer covering the planarization layer; and
   a touch layer disposed on the packaging layer, wherein the touch layer comprises a touch signal line and a touch electrode pattern, one end of the touch signal line being electrically connected to the touch electrode pattern, the other end of the touch signal line, extending from the display region to the pad region and traveling through the first segment boundary, and being electrically connected to a pad in the pad region;
   wherein the packaging layer comprises an organic layer, an edge of the organic layer on a same side of the display region as the first side of the planarization layer being disposed in the first groove, and a distance between the edge of the organic layer and the first segment boundary of the planarization layer being greater than a distance between the edge of the organic layer and the second segment boundary.

2. The display panel according to claim 1, wherein
   the first side of the planarization layer comprises a first segment ramp and a second segment ramp that are connected, wherein a bottom side of the first segment ramp is the first segment boundary and a bottom side of the second segment ramp is the second segment boundary; and
   a height of the first segment ramp is greater than a height of the second segment ramp, wherein the height of the first segment ramp is a distance from a top surface of the first segment ramp to a bottom surface of the substrate in the direction perpendicular to a bearing surface of the substrate, and the height of the second segment ramp is a distance from a top surface of the second segment ramp to the bottom surface of the substrate in the direction perpendicular to the bearing surface of the substrate.

3. The display panel according to claim 2, wherein a distance between an edge of the first dam opposite to the second segment boundary and the second segment boundary is less than a distance between an edge of the first dam opposite to the first segment boundary and the first segment boundary.

4. The display panel according to claim 1, further comprising a thin film transistor array layer on which the planarization layer is disposed;
wherein the thin film transistor array layer comprises a gate line and a data line that extend from the display region to the pad region and travel through the second segment boundary.

5. The display panel according to claim 1, wherein a length of the organic layer between the first segment boundary and the first dam in the extending direction of the edge of the first side is within a range of 1 mm to 3 mm.

6. The display panel according to claim 1, wherein the distance between the edge of the organic layer and the first segment boundary is within a range of 50 μm to 150 μm.

7. The display panel according to claim 1, wherein the first side of the planarization layer, along the extending direction of the edge of the first side, comprises two of the first segment boundaries respectively disposed at both sides of the second segment boundary.

8. The display panel according to claim 1, wherein a first ramp with a ramp angle within a range of 1 degree to 35 degrees is formed by the organic layer between the first segment boundary and the first dam.

9. The display panel according to claim 1, wherein
the planarization layer comprises a first planarization layer and a second planarization layer; and
the display region further comprises a first pixel definition layer disposed on the second planarization layer;
wherein a second ramp is formed by the first planarization layer and the second planarization layer corresponding to the first segment boundary, and a portion, proximal to the pad region, of the first pixel definition layer, and edges of the first planarization layer and the second planarization layer corresponding to the first segment boundary are overlapped with an edge of the first pixel definition layer.

10. The display panel according to claim 9, wherein a ramp angle of the second ramp is within a range of 35 degrees to 55 degrees.

11. The display panel according to claim 9, wherein a distance between an edge of the first dam opposite to the second segment boundary and the second segment boundary is less than a distance between the edge of the first dam opposite to the second segment boundary and an edge of the first pixel definition layer opposite to the second segment boundary.

12. The display panel according to claim 9, further comprising a second dam disposed in the peripheral region and surrounding the first dam;
wherein a second groove is defined between the first dam and the second dam; a height of the second dam is greater than a height of the first dam; and a distance between a first surface of the planarization layer and a second surface of the first pixel definition layer is greater than the height of the second dam;
wherein the height of the first dam is a distance between a top surface, distal from the substrate, of the first dam and the first surface of the planarization layer in the direction perpendicular to the bearing surface of the substrate, the height of the second dam is a distance between a top surface, distal from the substrate, of the second dam and the first surface of the planarization layer in the direction perpendicular to the bearing surface of the substrate, the first surface of the planarization layer is a surface, proximal to the substrate, of the planarization layer, and the second surface of the first pixel definition layer is a surface, distal from the substrate, of the first pixel definition layer.

13. The display panel according to claim 12, wherein
the first dam comprises a third planarization layer, a second pixel definition layer and a photo spacer layer that are sequentially laminated; and
the second dam comprises the third planarization layer, a fourth planarization layer, the second pixel definition layer, and the photo spacer layer that are sequentially laminated;
wherein the third planarization layer and the first planarization layer are disposed in a same layer, the fourth planarization layer and the second planarization layer are disposed in a same layer, and the second pixel definition layer and the first pixel definition layer are disposed in a same layer.

14. The display panel according to claim 1, wherein the touch electrode pattern comprises a plurality of touch drive electrodes and a plurality of touch sense electrodes that are crosswise arranged;
wherein intersections of the touch drive electrodes and the touch sense electrodes are insulated and separated by a touch insulation layer, and each of the touch drive electrodes and each of the touch sense electrodes are both correspondingly connected to one of the touch signal lines.

15. The display panel according to claim 1, wherein the packaging layer further comprises a first inorganic packaging layer and a second inorganic encapsulating layer, and the organic layer is disposed between the first inorganic packaging layer and the second inorganic packaging layer.

16. The display panel according to claim 1, wherein in the display region, a thin film transistor array layer, the planarization layer, a first pixel definition layer, a photo spacer layer, a light emitting layer, the packaging layer, and the touch layer are laminated on the substrate.

17. The display panel according to claim 16, wherein in the peripheral region, the thin film transistor array layer, a third planarization layer, a fourth planarization layer, a second pixel definition layer, the photo spacer layer, the packaging layer, and the touch layer are laminated on the substrate.

18. The display panel according to claim 17, further comprising a polarizer and a cover plate laminated on the touch layer.

19. A method for manufacturing a display panel, comprising:
forming a first dam, a planarization layer, and a packaging layer on a substrate, wherein the substrate comprises a display region, a peripheral region surrounding the display region, and a pad region disposed at a side, distal from the display region, of the peripheral region;
wherein the first dam is disposed in the peripheral region and surrounding the display region; the planarization layer is disposed within the first dam, a first groove is defined between the first dam and the planarization layer, an edge of a first side of the planarization layer, along an extending direction of the edge of the first side, comprises a first segment boundary and a second segment boundary that are connected, and the first side and the pad region are disposed on a same side of the display region; and
the packaging layer comprises an organic layer, a distance between an edge of the organic layer and the first segment boundary of the planarization layer being greater than a distance between the edge of the organic layer and the second segment boundary; and forming a touch layer on the packaging layer, wherein the touch layer comprises a touch signal line and a touch electrode pattern, one end of the touch signal line being electrically connected to the touch electrode pattern, the other end of the touch signal line, extending from the display region to the pad region and traveling through the first segment boundary, and being electrically connected to a pad in the pad region.

20. A display device comprising a display panel, wherein the display panel comprises:
a substrate comprising:
a display region,
a peripheral region surrounding the display region, and
a pad region disposed on a side, distal from the display region, of the peripheral region,
a first dam disposed in the peripheral region and surrounding the display region;
a planarization layer disposed within the first dam, wherein a first groove is defined between the first dam and the planarization layer, and wherein an edge of a first side of the planarization layer, along an extending direction of the edge of the first side, comprises a first segment boundary and a second segment boundary that are connected, and the first side and the pad region are disposed on a same side of the display region;
a packaging layer covering the planarization layer; and
a touch layer disposed on the packaging layer, wherein the touch layer comprises a touch signal line and a touch electrode pattern, one end of the touch signal line being electrically connected to the touch electrode pattern, the other end of the touch signal line, extending from the display region to the pad region and traveling through the first segment boundary, and being electrically connected to a pad in the pad region;
wherein the packaging layer comprises an organic layer, an edge of the organic layer on a same side of the display region as the first side of the planarization layer being disposed in the first groove, and a distance between the edge of the organic layer and the first segment boundary of the planarization layer being greater than a distance between the edge of the organic layer and the second segment boundary.

* * * * *